United States Patent [19]
Bosi-Goldberg

[11] Patent Number: 5,890,106
[45] Date of Patent: Mar. 30, 1999

[54] ANALYSIS-/SYNTHESIS-FILTERING SYSTEM WITH EFFICIENT ODDLY-STACKED SINGLEBAND FILTER BANK USING TIME-DOMAIN ALIASING CANCELLATION

[75] Inventor: Marina Bosi-Goldberg, Redwood City, Calif.

[73] Assignee: Dolby Laboratories Licensing Corporation, San Francisco, Calif.

[21] Appl. No.: 821,017

[22] Filed: Mar. 19, 1997

Related U.S. Application Data

[60] Provisional application No. 60/057,874 Mar. 19, 1996.
[51] Int. Cl.$^6$ ........................................................ G10L 7/06
[52] U.S. Cl. ........................................... 704/203; 704/211
[58] Field of Search ........................... 704/201, 203–209, 704/211, 226, 229–230, 500, 501

[56] References Cited

U.S. PATENT DOCUMENTS

| | | | |
|---|---|---|---|
| 5,109,417 | 4/1992 | Fielder et al. | 704/205 |
| 5,185,800 | 2/1993 | Mahieux | 704/229 |
| 5,222,189 | 6/1993 | Fielder | 704/229 |
| 5,297,236 | 3/1994 | Antill et al. | 704/203 |
| 5,394,473 | 2/1995 | Davidson | 704/211 |

FOREIGN PATENT DOCUMENTS 0511692  11/1992  European Pat. Off. ........ G11B 20/00

OTHER PUBLICATIONS

E.O. Brigham, *The Fast Fourier Transform*, Englewood Cliffs, NJ: Prentice–Hall, Inc., 1974, pp. 166–169.

A.V. Oppenheim and R.W. Schafer, *Digital Signal Processing*, Englewood Cliffs, N.J.: Prentice–Hall, Inc., 1975, pp. 307–317.

M.J. Narasimha and A.M. Peterson, "On the Computation of the Discrete Cosine Transform," *IEEE Trans. Comm.*, COM–26, Jun. 1978, pp. 934–936.

J. Tribolet and R. Crochiere, "Frequency Domain Coding of Speech," *IEEE Trans. Acoust., Speech, and Signal Proc.*, Oct. 1979, pp. 512–530.

R. Crochiere and L. Rabiner, "Multirate Digital Signal Processing," Prentice–Hall, 1983, pp. 366–376.

J. Princen and A. Bradley, "Analysis/Synthesis Filter Bank Design Based on Time Domain Aliasing Cancellation," *IEEE Trans. on Acoust., Speech, Signal Proc.*, ASSP–34, 1986, pp. 1153–1161.

(List continued on next page.)

*Primary Examiner*—David D. Knepper
*Attorney, Agent, or Firm*—Gallagher & Lathrop; David N. Lathrop

[57] ABSTRACT

An efficient implementation of oddly-stacked critically-sampled single sideband analysis/synthesis filter banks is achieved by application of a set of functions to time-domain and frequency-domain values before and after transformation. In one embodiment of an analysis filter bank, a forward pre-transform function groups blocks of N samples into blocks of ¼N modified samples, a discrete transform generates frequency-domain coefficients in response to the modified samples, and a forward post-transform function generates spectral information in response to the frequency-domain transform coefficients. In one embodiment of a synthesis filter bank, an inverse pre-transform function groups spectral information into blocks of ¼N frequency-domain transform coefficients, a discrete transform generates blocks of ¼N time-domain transform coefficients in response to the frequency-domain transform coefficients, and an inverse post-transform function generates blocks of N time-domain samples in response to the time-domain transform coefficients. An implementation of an oddly-stacked Time Domain Aliasing Cancellation transform permits the length of the transformation to be adaptively selected.

20 Claims, 5 Drawing Sheets

OTHER PUBLICATIONS

J. Princen, A. Johnson, and A. Bradley, "Subband/Transform Coding Using Filter Bank Designs Based on Time Domain Aliasing Cancellation," *ICASSP 1987 Conf. Proc.,* May 1987, pp. 2161–2164.

S. Cramer and R. Gluth, "Computationally Efficient Real–Valued Filter Banks Based on a Modified $O^2DFT$," *Signal Processing V: Theories and Applications,* Elsevier Science Publishers B.V., 1990, pp. 585–588.

M. Vetterli and D. Le Gall, "Perfect Reconstruction FIR Filter Banks: Some Properties and Factorizations", *IEEE Trans. Acoust., Speech, and Signal Proc.,* vol. 37, Jul. 1989, pp. 1057–1071.

T.P. Barnwell, III and M.J.T. Smith, "Filter Banks for Analysis–Reconstruction Systems: A Tutorial," *Proceedings, IEEE International Symposium on Circuits and Systems,* May 1990, pp. 1999–2003.

H. Malvar, "Lapped Transforms for Efficient Transform/Subband Coding," *IEEE Trans. Acoust., Speech, and Signal Proc.,* ASSP–38, Jun. 1990, pp. 969–978.

R. Gluth, "Regular FFT–Related Transform Kernels for DCT/DST–Based Polyphase Filter Banks," *ICASSP 1991 Conf. Proc.,* vol. 3, May 1991, pp. 2205–2208.

P. Duhamel, Y. Mahieux, and J. Petit, "A Fast Algorithm for the Implementation of Filter Banks Based on Time Domain Aliasing Cancellation," *ICASSP 1991 Conf. Proc.,* vol. 3, May 1991, pp. 2209–2212.

ANALYSIS-/SYNTHESIS-FILTERING SYSTEM WITH EFFICIENT ODDLY-STACKED SINGLEBAND FILTER BANK USING TIME-DOMAIN ALIASING CANCELLATION

CROSS-REFERENCE TO RELATED APPLICATIONS

This application claims priority benefits of prior filed copending provisional application Ser. No. 08/618,506 filed Mar. 19, 1996, now abandoned. This provisional application was originally filed 60/057,874, filed Mar. 19, 1996, as a nonprovisional application and was converted to a provisional application by petition.

TECHNICAL FIELD

The invention relates in general to signal analysis filtering and signal synthesis filtering. More particularly, the invention relates to efficient implementation of filter banks such as oddly-stacked single-sideband analysis and synthesis filter banks with time-domain aliasing cancellation. The length of the filter bank may be adaptively selected.

Throughout the following discussion and especially in the background discussion, more particular mention will be made of audio applications; however, the present invention is applicable to a broader range of applications including video.

BACKGROUND ART

INTRODUCTION

Efforts to develop more efficient means to transmit or store information has included reducing informational requirements, that is, reducing the amount of information required to adequately represent a signal during transmission or storage, and reducing processing resource requirements, that is, reducing the amount of processing required to implement the encoding and decoding processes.

With respect to reducing informational requirements, many high-quality audio coding applications, for example, exploit various psychoacoustic effects. So called split-band coding techniques which divide the useful signal bandwidth into narrow bands with bandwidths approximating the human ear's critical bands can exploit psychoacoustic masking effects. Such split-band techniques divide the signal bandwidth with an analysis filter bank, process the signal passed by each filter band, and reconstruct a replica of the original signal with a synthesis filter bank.

Two common split-band coding techniques are subband coding and transform coding. These techniques reduce informational requirements in particular frequency bands such that noise caused by the resulting coding inaccuracy is rendered inaudible by other spectral components. Subband coders may be implemented by a bank of digital bandpass filters defining subbands of varying bandwidth. Transform coders may be implemented by any of several time-domain to frequency-domain transforms. One or more adjacent transform coefficients are grouped together to define "subbands" having effective bandwidths which are sums of individual transform coefficient bandwidths.

The mathematical basis for digital subband filter banks and block transforms is essentially the same. See Tribolet and Crochiere, "Frequency Domain Coding of Speech," *IEEE Trans, Acoust., Speech, and Signal Proc*, Oct., 1979, pp. 512–30. Each type of split-band processing can be expressed in terms of a transform applied to an interval or "block" of signal samples; therefore, throughout the following discussion, terms such as "filters" and "transforms" are generally interchangeable. The term "subband" refers to portions of the useful signal bandwidth whether implemented by a true subband coder or a transform coder.

With respect to reducing processing resource requirements, much improvement can be realized in many digital coding applications by reducing the computational complexity of subband filtering. Reduced computational complexity permits the implementation of systems which are less expensive to build, or which impose lower signal propagation delays through the system.

Many coding systems use single-sideband (SSB) filter banks. A "single-sideband" filter bank, as discussed in R. Crochiere and L. Rabiner, "Multirate Digital Signal Processing," Prentice-Hall, 1983, pp. 366–376, generates a spectral representation having component values which are either purely real or purely imaginary in response to real-valued input signal samples.

Two well known SSB analysis filter banks implemented by overlapping-block transforms permit perfect reconstruction with critical sampling using time-domain aliasing cancellation (TDAC). One filter bank, described in J. Princen and A. Bradley, "Analysis/Synthesis Filter Bank Design Based on Time Domain Aliasing Cancellation," *IEEE Trans, on Acoust., Speech, Signal Proc.*, ASSP-34, 1986, pp. 1153–1161, comprises the alternate application of a modified Discrete Cosine Transform (DCT) with a modified Discrete Sine Transform (DST) and is described as the time-domain equivalent of an evenly-stacked critically-sampled single-sideband analysis-synthesis system. The modified DCT and modified DST are referred to collectively herein as the Evenly-stacked Time-Domain Aliasing Cancellation (E-TDAC) transform. The second filter bank, described in J. Princen, A. Johnson, and A. Bradley, "Subband/Transform Coding Using Filter Bank Designs Based on Time Domain Aliasing Cancellation," *ICASSP 1987 Conf, Proc.*, May 1987, pp. 2161–64, is implemented by a single modified DCT and is described as the time-domain equivalent of an oddly-stacked critically sampled single-sideband analysis-synthesis system. It is referred to herein as the Oddly-stacked Time-Domain Aliasing Cancellation (O-TDAC) transform. Each of the TDAC analysis filter banks are applied to signal sample blocks which overlap but they achieve perfect reconstruction with critically sampling by effectively discarding some of the transform coefficients. The missing coefficients cause time-domain aliasing in a companion synthesis filter bank but the aliasing is cancelled by overlapping and adding the blocks generated by the synthesis filter bank.

The use of TDAC filter banks is very attractive in many coding application because these filter banks permit perfect reconstruction using overlapping-block transforms that are critically sampled and they can be implemented using reasonably efficient methods. For example, implementations that are more efficient than straight-forward computation methods are disclosed in S. Cramer and R. Gluth, "Computationally Efficient Real-Valued Filter Banks Based on a Modified $O^2DFT$." *Signal Processing V; Theories and Applications*, Elsevier Science Publishers B. V., 1990, pp. 585–588; H. Malvar, "Lapped Transforms for Efficient Transform/Subband Coding," *IEEE Trans. Acoust., Speech, and Signal Proc.*, ASSP-38, June 1990, pp. 969–78; R. Gluth, "Regular FFT-Related Transform Kernels for DCT/DST-Based Polyphase Filter Banks," *ICASSP 1991 Conf, Proc., vol.* 3, May 1991, pp. 2205–2208; and P. Duhamel, Y.

Mahieux, and J. Petit, "A Fast Algorithm for the Implementation of Filter Banks Based on Time Domain Aliasing Cancellation," *ICASSP* 1991 *Conf, Proc.*, vol. 3, May 1991, pp. 2209–2212.

Each of these references describes implementations of filter banks which are applied to fixed-length blocks of signal samples, that is, blocks that have a number of samples N which does not vary from block to block. Unfortunately, the length of fixed-length blocks must be chosen to balance a trade off between the temporal and spectral resolution of the filter bank. On one hand, greater block lengths improve the selectivity or frequency-resolving power of a filter bank, and better filter selectivity generally improves the ability of a coder to exploit psychoacoustic masking effects. On the other hand, greater block lengths degrade the time-resolution of a subband filter bank. Low time-resolution can result in audible distortion artifacts when coder quantizing errors of signal events, such as transients, producing pre-transient and post-transient ringing which exceed the ear's temporal psychoacoustic masking interval. As a result of this trade off, it is desirable to implement adaptive-length filter banks that can be applied to signal sample blocks of varying length in order to optimize coder performance.

U.S. Pat. No. 5,297,236 describes reasonably efficient implementations of both fixed- and adaptive-length filter banks. In particular, implementations of E-TDAC and O-TDAC filter banks are disclosed; however, the efficiency of these implementations is not optimal and the techniques disclosed for O-TDAC filter banks are computationally more intensive than those disclosed for E-TDAC filter banks.

DISCLOSURE OF INVENTION

It is an object of the present invention to provide a computationally efficient implementation of adaptive-lengthe analysis and synthesis filter banks.

Other objects and advantageous embodiments of the present invention are set forth throughout this disclosure. Although the invention is more particularly described for audio encoding and decoding applications, it should be appreciated that the invention is much broader and may be applied to other applications. Discussion of encoders incorporating the present invention pertain generally to signal-analysis filtering, and discussion of decoders incorporating the present invention pertains generally to signal-synthesis filtering.

In accordance with the teachings of the present invention in one embodiment of an analysis-filtering apparatus, input signal samples representing audio or video information are grouped into time-domain signal sample blocks of non-zero length N=a+b, where a and b are non-negative radix 4 integers and either a or b has a different value for at least two of the time-domain signal sample blocks, wherein adjacent blocks in a sequence of the time-domain signal sample blocks overlap one another, a respective block overlapping a previous block by a samples and overlapping a subsequent block by b samples, blocks of at least one but not more than ¼N complex-valued modified samples are generated, frequency-domain transform coefficients are generated by applying one or more discrete transform functions to the blocks of modified samples, spectral information is generated by applying a forward post-transform function to the frequency-domain transform coefficients, and a representation of the spectral information is assembled into a form suitable for transmission or storage.

In accordance with the teachings of the present invention in one embodiment of a synthesis-filtering apparatus, sets of frequency-domain transform coefficients are generated from received spectral information, where each set comprises at least one but not more than ¼N=¼(a+b) coefficients, a and b are non-negative radix 4 integers and either a or b has a different value in at least two of the sets, time-domain transform coefficients are generated by applying one or more inverse transform functions to the sets of frequency-domain transform coefficients, blocks of time-domain signal samples are generated by applying an inverse post-transform function to the time-domain transform coefficients, where each block is of non-zero length N=a+b, adjacent blocks in a sequence of the time-domain signal sample blocks overlap one another, a respective block overlapping a previous block by a samples and overlapping a subsequent block by b samples, and output samples representing audio or video information are generated in response to the time-domain signal sample blocks.

Embodiments of coding systems incorporating the present invention are set forth in the following discussion and in the accompanying drawings, in which like features are referred to by like reference numbers.

MODES FOR CARRYING OUT THE INVENTION

A. Overview of Function Structure

Figure 1:
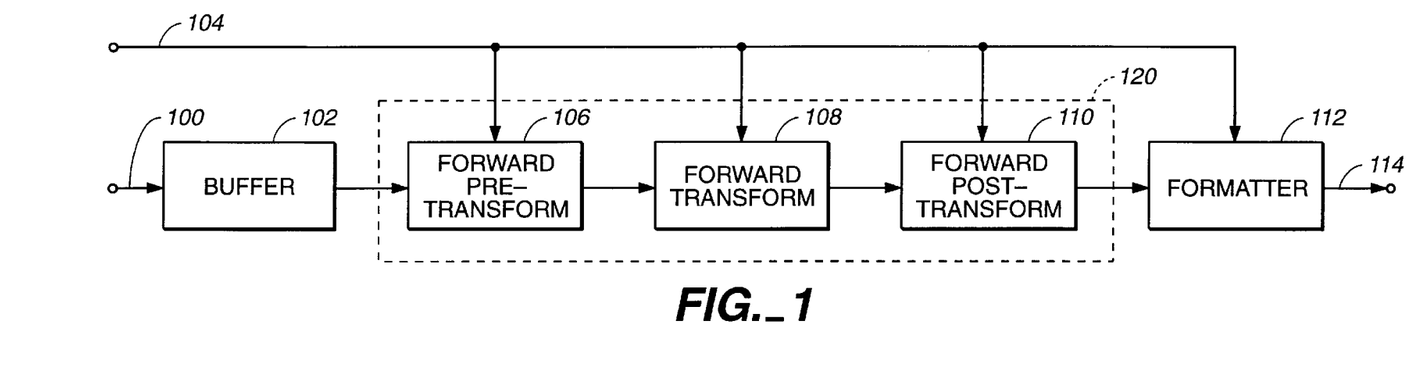
FIG. 1 is a functional block diagram illustrating the basic functional structure of an analysis-filtering apparatus incorporating an embodiment of the present invention.

FIG. 1 illustrates the basic functional structure of an analysis-filtering apparatus incorporating an embodiment of the present invention. According to this structure, the apparatus comprises buffer 102 which buffers input samples received from input path 100 into time-domain signal sample blocks, forward pre-transform 106 which generates modified samples from the signal samples received from buffer 102 and in response to information received from path 104 establishing the number of signal samples constituting a time-domain signal sample block, forward transform 108 which transforms the modified samples into frequency-domain transform coefficients by applying a transform whose length is adapted in response to information received from path 104, forward post-transform 110 which generates spectral information from the frequency-domain transform coefficients and in response to the information received from path 104, and formatter 112 which assembles digital information including a representation of the spectral information into a form suitable for transmission or storage along path 114. The representation can be in many forms including the spectral information itself or an encoded form obtained by encoding the spectral information according to psychoacoustic principles, for example. The functions performed by forward pre-transform 106, forward transform 108 and forward post-transform 110 implement analysis filter bank 120. The functions performed by buffer 102 and formatter 112 are not discussed in detail herein.

Figure 2:
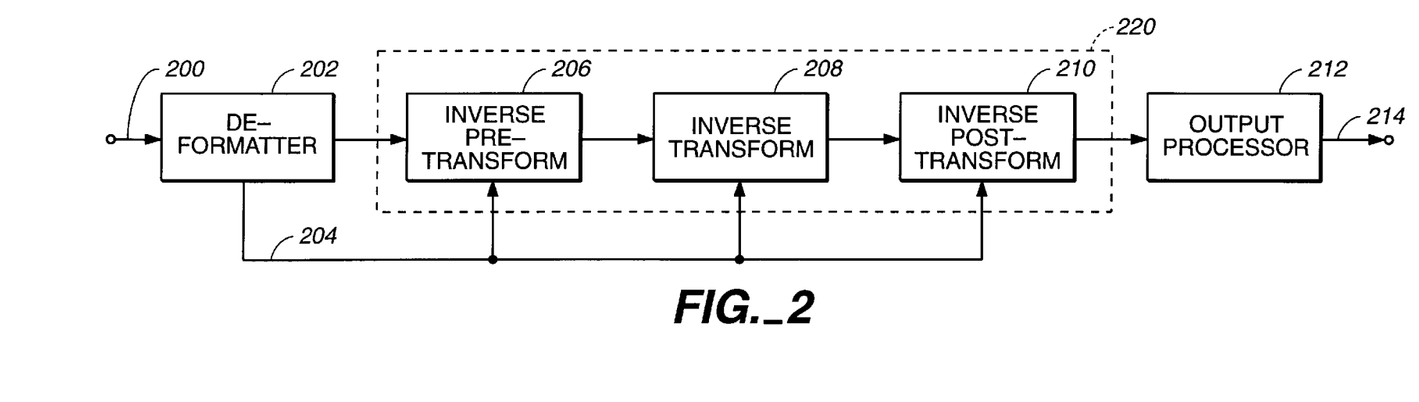
FIG. 2 is a functional block diagram illustrating the basic functional structure of a synthesis-filtering apparatus incorporating an embodiment of the present invention.

FIG. 2 illustrates the basic functional structure of a synthesis-filtering apparatus incorporating an embodiment of the present invention. According to this structure, the apparatus comprises deformatter 202 which obtains spectral information and information establishing the inverse transform length from a signal received from path 200, inverse pre-transform 206 which generates frequency-domain transform coefficients from the extracted spectral information and in response to the information establishing the inverse transform length received along path 204, inverse transform 208 which transforms the frequency-domain transform coefficients into time-domain transform coefficients by applying a transform whose length is adapted in response to information received from path 204, inverse post-transform 210 which generates time-domain signal samples from the time-domain transform coefficients and in response to information received from path 204, and output processor 212 which, in response to the time-domain signal samples, generates along path 214 output samples. The signal received from path 200 can be in many forms including the spectral information itself or a form encoded according to psychoacoustic principles, for example. The functions performed by inverse pre-transform 206, inverse transform 208 and inverse post-transform 210 implement synthesis filter bank 220. The functions performed by deformatter 202 and output processor 212 are not discussed in detail herein.

It should be appreciated from a study of the following disclosure and the accompanying claims that some elements shown in FIGS. 1 and 2 are not required to practice various embodiments of the present invention.

B. Input Sample Buffering

A buffer, represented by box 102 in FIG. 1, receives signal samples and groups them into a sequence of time-domain signal sample blocks. The signal samples may be received from the sampling of an analog signal, from the generation of samples representing or simulating an analog signal, or from any other source of samples which correspond to a time-domain signal.

The frequency-resolving power or selectivity of a filter bank implemented by a discrete transform improves as the transform length increases. The filter selectivity may also be affected significantly by weighting the time-domain signal samples by a weighting function commonly called a window. See generally, Harris, "On the Use of Windows for Harmonic Analysis with the Discrete Fourier Transform," *Proc. IEEE*, vol. 66, January, 1978, pp. 51–83.

Both analysis- and synthesis-window weighting are used with the O-TDAC transform. It is assumed herein that, in practical embodiments incorporating the present invention, appropriate window weighting is performed as may be required or desired. For example, in an encoder or other analysis-filtering apparatus, window weighting may be performed prior to, concurrent with or subsequent to input sample buffering. In a decoder or other synthesis-filtering apparatus, window weighting, if required or desired, may be performed prior to or concurrent with output signal generation, discussed briefly below. The manner in which such window weighting is performed is not critical to the practice of the present invention.

C. Analysis Filter Bank

Analysis filter bank 120 may implemented in a straightforward manner by a Modified Discrete Cosine Transform (MDCT) of the form $$C(k) = \sum_{n=0}^{M-1} x(n)\cos\left[\frac{2\pi}{M}\left(k+\frac{1}{2}\right)(n+m)\right] \text{ for } 0 \leq k < M \quad (1)$$

where k=frequency-domain transform coefficient number,
n=time-domain signal sample number,
M=time-domain signal sample block length,
m=phase term required for TDAC (see equation 2),
x(n)=time-domain signal sample n, and
C(k)=MDCT frequency-domain transform coefficient k.

The O-TDAC transform generates spectral information comprising a set of ½M unique frequency-domain transform coefficients in response to each time-domain signal sample block because $C(M-1-k)=-C(k)$ for $0 \leq k < ½M$.

An accurate replica of the input signal cannot be recovered by merely applying an inverse transform to each set of MDCT coefficients. The result of the inverse transformation contains time-domain aliasing components and departs significantly from the input signal; however, Princen, et al. showed that, with the proper phase term m and a suitable pair of analysis-synthesis windows applied to overlapped blocks, the O-TDAC technique can cancel the time-domain aliasing component and accurately recover the input signal.

Figure 4:
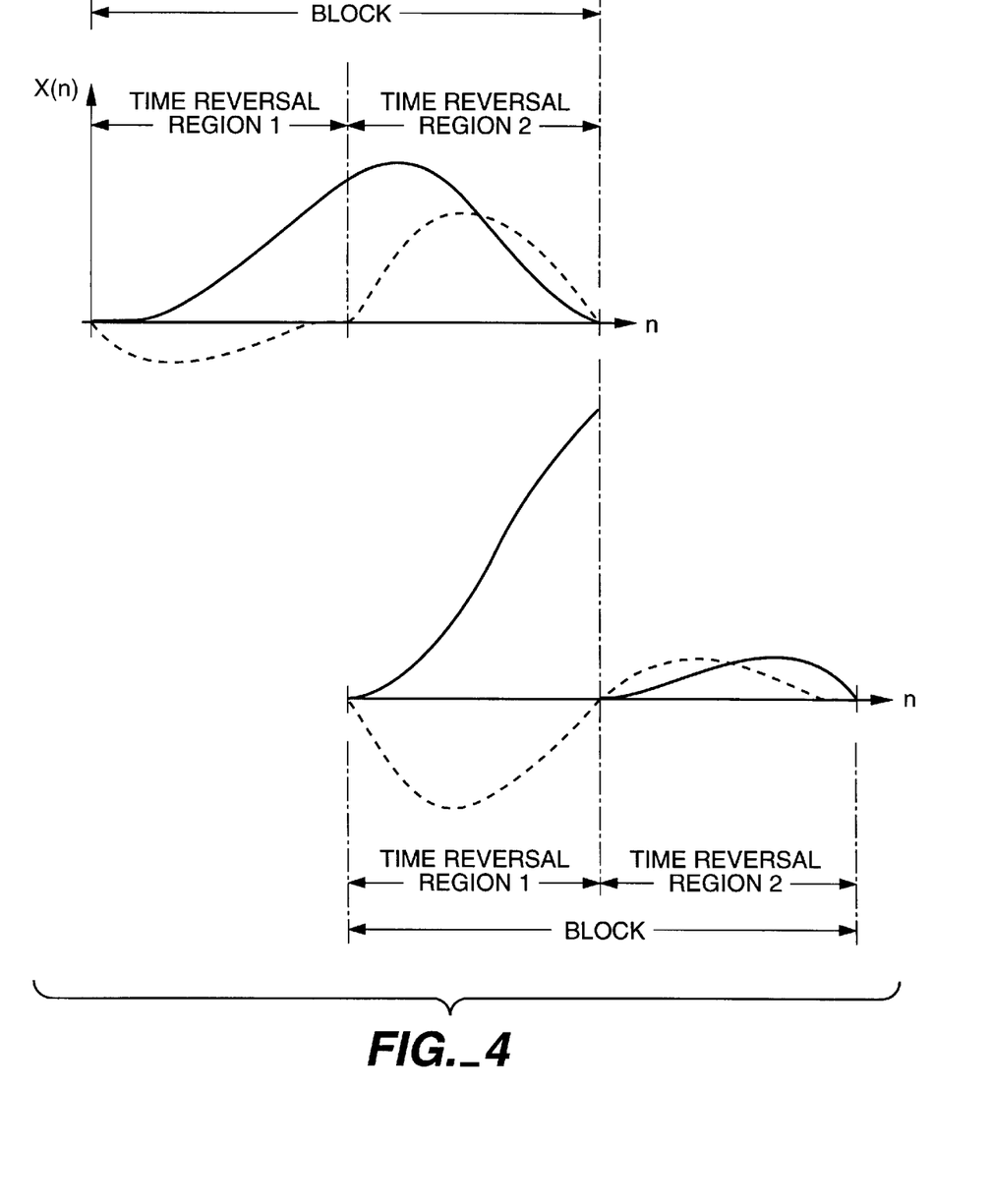
FIG. 4 is a hypothetical graphical representation illustrating the time-reversal regions of the time-domain aliasing component created by the O-TDAC transform using the conventional TDAC phase term.

The phase term m controls the phase shift of the time-domain aliasing component. To cancel this aliasing component and accurately recover the original time-domain input signal, the O-TDAC transform as disclosed by Princen, et al. requires a phase term such that the time-domain alias component consists of the first half of the sampled and windowed signal reversed in time about the one-quarter point of the sample block and having an amplitude inverted in sign, and further consists of the second half of the sampled and windowed signal reversed in time about the three-quarter point of the sample block. These relationships are illustrated in FIG. 4 which provides a hypothetical graphical representation of two adjacent overlapped M-sample length time-domain signal sample blocks recovered by an inverse O-TDAC transform, after being weighted by an appropriate synthesis window but before overlap-add of the adjacent blocks has cancelled time-domain aliasing. The desired signal component is represented by a solid line and the time-domain aliasing component is shown by a broken line. The representation of the various components in this and other figures does not show individual signal samples but instead illustrates the envelope of a hypothetical constant-amplitude signal resulting from the application of analysis- and synthesis-window functions.

As disclosed by Princen, et al., the phase term required to produce the appropriate aliasing components for alias cancellation for a fixed-length O-TDAC transform applied to a signal sample block weighted by a symmetric window function is $$m = \frac{M/2 + 1}{2} = \frac{M}{4} + \frac{1}{2}. \quad (2)$$

As mentioned above, it is desirable to implement adaptive-length filter banks that can be applied to signal sample blocks of varying length in order to optimize coder performance. Some of the considerations required to implement an adaptive-transform-length coder are not discussed here but are discussed in U.S. Pat. No. 5,394,473.

Changes in the length of the O-TDAC transform generally requires changes in the phase term m in order to realize time-domain aliasing cancellation. As discussed above, the aliasing component is a time-reversed replica of the windowed input signal samples which occurs in two separate regions. The phase term m for the O-TDAC transform controls the location of the boundary between these two regions. For fixed-length O-TDAC transforms, the boundary is located at the mid-point of the signal sample block. The phase term required for time-domain aliasing cancellation under this condition is shown in equation 2.

Figure 5:
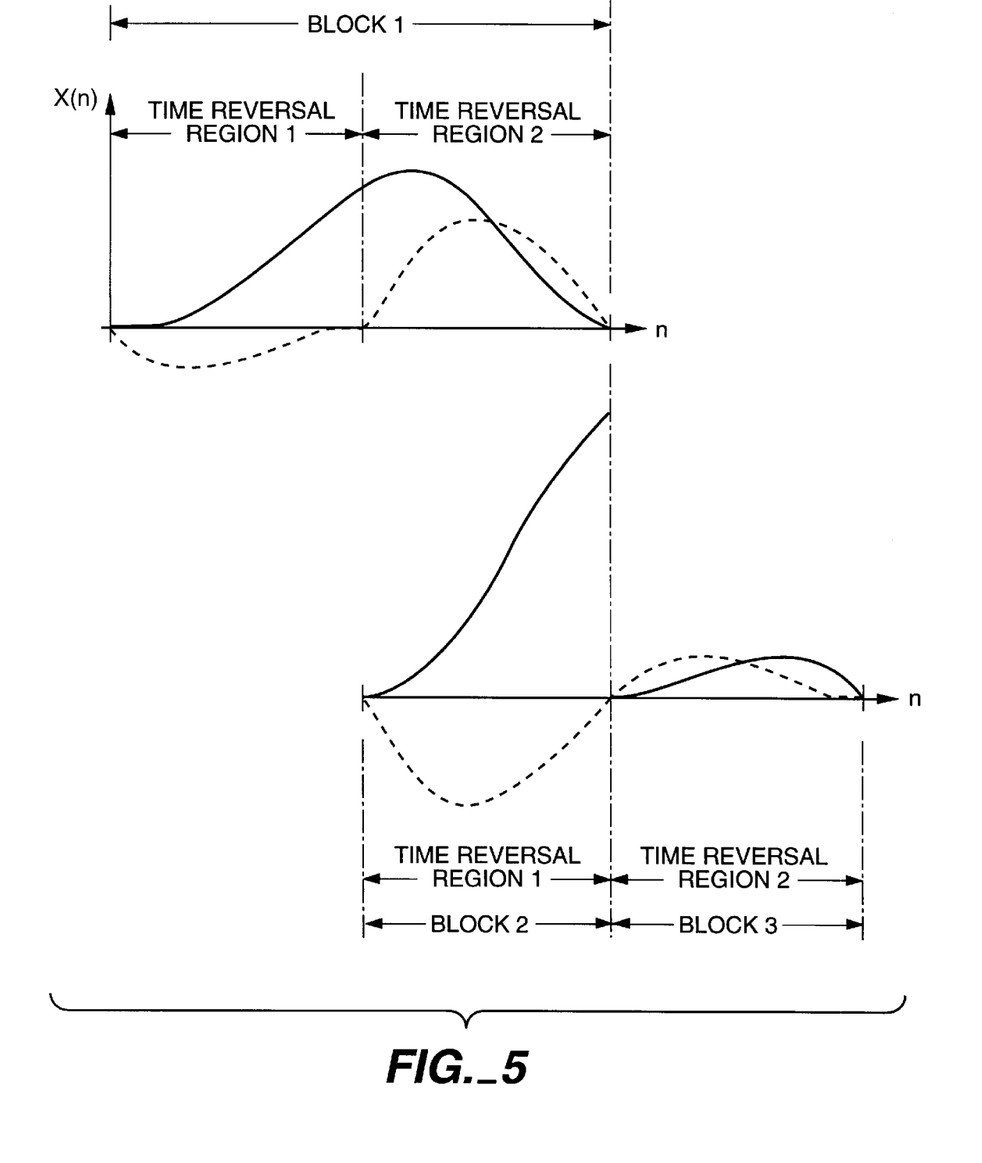
FIG. 5 is a hypothetical graphical representation illustrating the time-reversal regions of the time-domain aliasing component created by the O-TDAC transform using the TDAC phase term required to cancel time-domain aliasing in an N-sample length block overlapped with a subsequent ½N-sample length block.

FIG. 5 provides a hypothetical graphical representation similar to that illustrated in FIG. 4; however, FIG. 5 illustrates three blocks of varying length as recovered from an inverse O-TDAC transform prior to time-domain aliasing cancellation. The first block is of length M and both the second and third blocks are each of length ½M. The signal components and time-domain aliasing components in the blocks are represented by solid and broken lines, respectively. In order to achieve aliasing cancellation by overlap-adding the second half of the first block with the entire second block, the time-domain aliasing component in the second block must be a replica of the entire second block with inverted amplitude and time-reversed end-for-end. The phase term m required to produce such aliasing components in the second block is m=½.

As explained in U.S. Pat. No. 5,394,473 cited above, the phase term for the transform of each block may be written more generally as $$m = \frac{\phi + 1}{2}. \quad (3)$$

where $\phi$ is the location of the boundary between time-reversal regions, expressed as the number of time-domain signal samples from the right-hand or trailing edge of the block.

Figure 6:
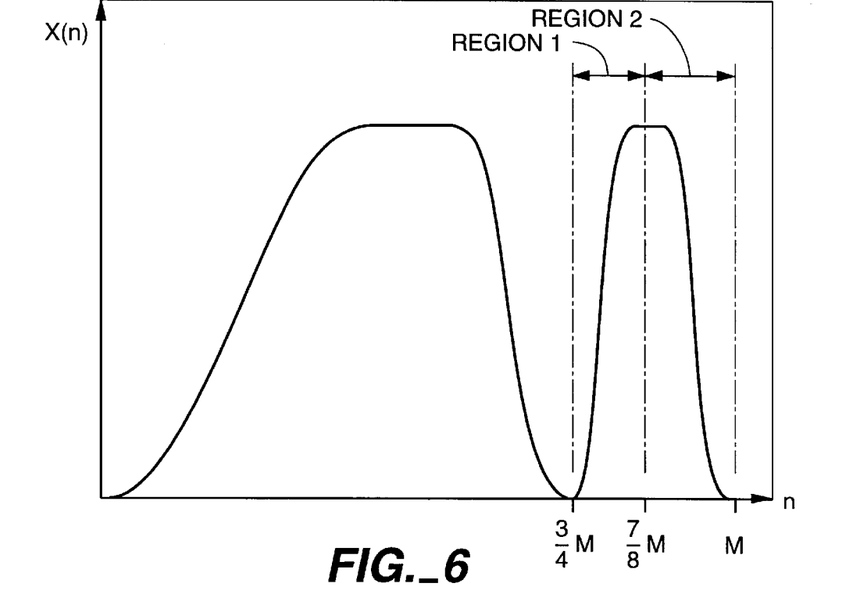
FIG. 6 is a hypothetical graphical representation illustrating the boundary between time-reversal regions of the time-domain aliasing component in a ¼N-sample length block.

For example, FIG. 6 illustrates two non-overlapping window-weighted time-domain signal sample blocks. The right-hand block is ¼M samples in length. Within this block, the boundary between time-reversal regions is at a point M/8 samples from the right-hand or trailing edge of the block. Thus, the phase term m required to cause time-reversal of the aliasing component within each region of the ¼M-sample block is $$m = \frac{M/8 + 1}{2}.$$

Figure 7:
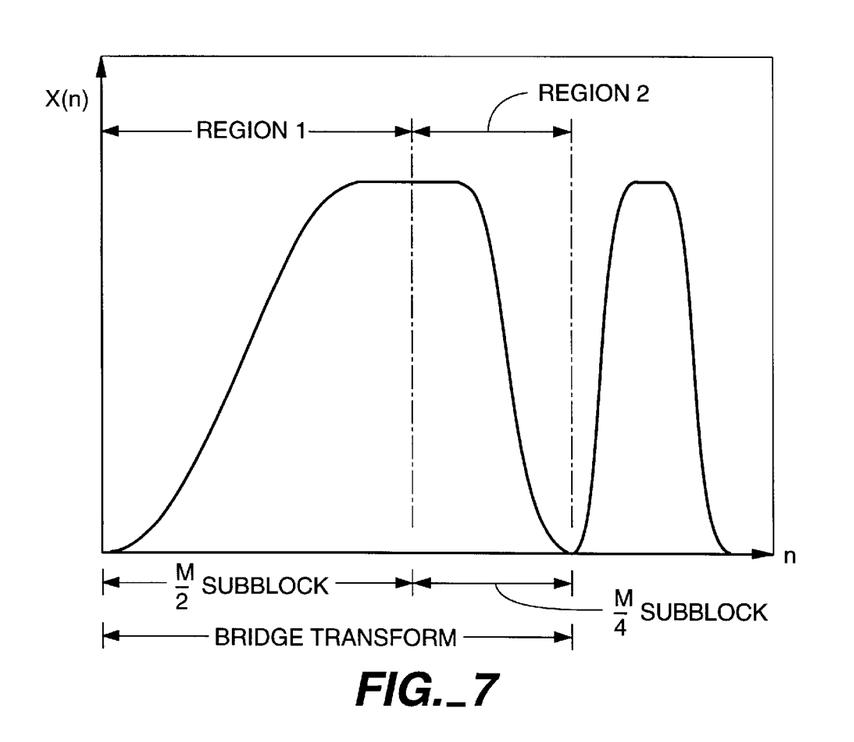
FIG. 7 is a hypothetical graphical representation of a bridge transform illustrating the time-reversal regions of the time-domain aliasing component.

With this background established, it is now possible to introduce the "bridge transform." A bridge transform is a transform which bridges a shift from one transform length to another. FIG. 7, for example, illustrates the result of applying an O-TDAC filter bank to one block of ½M samples followed by another block of ¼M samples.

It is possible to perform a separate transform for each block. For reasons whose explanation exceed the scope of this discussion, a bridge transform improves coder performance by instead transforming a single block of ¾M samples. The bridge transform required to process the ¾M-sample block shown in FIG. 7 may be implemented by a Fast Fourier Transform (FFT) to compute the transform for three ¾M blocks followed by a recombination operation. This technique is discussed in Oppenheim and Schafer, *Digital Signal Processing*, Englewood Cliffs, N.J.: Prentice-Hall, Inc., 1975, pp. 307–14.

For the synthesis filter bank discussed below, the same considerations for adaptive-length transforms and bridge transforms that were discussed above for the forward transform, including the phase term required for time-domain aliasing cancellation, also apply to the inverse transform.

In the following discussion, each time-domain signal sample block contains exactly a+b samples, where a+b=N>0. The values a and b, as well as the sum N, are constrained to be radix 4 integers that may vary from block to block. Either a or b, but not both, may equal zero in any given block. A respective block overlaps the immediately prior block by a samples and overlaps the immediately subsequent block by b samples; hence, the boundary between time-reversal regions is to coincide with the boundary between the two subblocks, or at b samples from the trailing edge of the block. In a respective block, if either a or b is equal to zero, that block overlaps an adjacent block by zero samples, which means that the two adjacent blocks abut one another. From equation 3, the phase term m in the MDCT required to achieve this boundary is $$m = \frac{\phi + 1}{2} = \frac{b + 1}{2}. \quad (4)$$

FIG. 7, for example, illustrates a bridge transform block of N=¾M samples in which a=½M samples and b=¼M samples.

D. Efficient Adaptive-Length Analysis Filter Bank

The processing resources required to implement the analysis filter bank according to one embodiment may be reduced by applying a forward pre-transform function to the time-domain signal sample blocks to produce blocks of ¼N modified samples, applying one or more transforms to the modified sample blocks, and applying a forward post-transform function to the transform coefficients to obtain the desired TDAC coefficients. As explained below, in certain applications the forward post-transform function may be null or trivial.

The mathematical basis for this implementation may be seen by first expressing the MDCT of expression 1 as the sum of two transforms, as follows:

$$C(k) = \sum_{n=0}^{\frac{a}{2}-1} \left\{ x\left(\frac{a}{2} - i - 1\right) \cos\left[\frac{2\pi}{N}\left(k + \frac{1}{2}\right)\left(\frac{a}{2} - i - 1 + m\right)\right] \right\} + \quad (5a)$$

$$\left\{ x\left(\frac{a}{2} + i\right) \cos\left[\frac{2\pi}{N}\left(k + \frac{1}{2}\right)\left(\frac{a}{2} + i + m\right)\right] \right\} + \quad (5b)$$

$$\sum_{i=\frac{a}{2}}^{\frac{N}{2}-1} \left\{ x\left(\frac{a}{2} + i\right) \cos\left[\frac{2\pi}{N}\left(k + \right.\right.\right. \quad (5c)$$

-continued $$\left\{ x\left(N+\frac{a}{2}-1-i\right)\cos\left[\frac{2\pi}{N}\left(k+\frac{1}{2}\right)\left(\frac{a}{2}+i+m\right)\right]\right\}+ \quad (5d)$$

$$\left.\frac{1}{2}\right)\left(N+\frac{a}{2}-1-i+m\right)\right]\right\} \text{ for } 0 \leq k < N.$$

The first transform, shown in expressions 5a and 5b, is applied to the first subblock of a samples. Expression 5a corresponds to the samples in the first half of this subblock, and expression 5b corresponds to the samples in the second half of this subblock. The second transform, shown in expressions 5c and 5d, is applied to the second subblock of b samples. Expressions 5c and 5d correspond to the samples in the first and second halves of this subblock, respectively.

From equation 4 it can be seen that $$\frac{a}{2}+m=\frac{a}{2}+\frac{b+1}{2}=\frac{a+b}{2}+\frac{1}{2}=\frac{N}{2}+\frac{1}{2}. \quad (6)$$

This equivalence is substituted into expressions 5a through 5d and the sign of the cosine argument in expressions 5a and 5d are inverted. The sign of the cosine argument may be inverted without affecting the value of the overall expression because the cosine function is an even function. The result obtained from these operations is:

$$C(k) = \sum_{n=0}^{\frac{a}{2}-1}\left\{x\left(\frac{a}{2}-i-1\right)\cos\left[\frac{2\pi}{N}\left(k+\frac{1}{2}\right)\left(-\frac{N}{2}+i+\frac{1}{2}\right)\right]\right\}+ \quad (7a)$$

$$\left\{x\left(\frac{a}{2}+i\right)\cos\left[\frac{2\pi}{N}\left(k+\frac{1}{2}\right)\left(\frac{N}{2}+i+\frac{1}{2}\right)\right]\right\}+ \quad (7b)$$

$$\sum_{i=\frac{a}{2}}^{\frac{N}{2}-1}\left\{x\left(\frac{a}{2}+i\right)\cos\left[\frac{2\pi}{N}\left(k+\frac{1}{2}\right)\left(\frac{N}{2}+i+\frac{1}{2}\right)\right]\right\}+ \quad (7c)$$

$$\left\{x\left(N+\frac{a}{2}-1-i\right)\cos\left[\frac{2\pi}{N}\left(k+\frac{1}{2}\right)\left(-\frac{3N}{2}+i+\frac{1}{2}\right)\right]\right\} \text{ for } 0 \leq k < N. \quad (7d)$$

By making substitutions using the following two identities, $$\cos(\theta + k\pi) = (-1)^k\cos\theta \quad (8)$$

$$\cos\left(\theta \pm \frac{\pi}{2}\right) = \mp\sin\theta \quad (9)$$

the two subblock transforms in expressions 7a through 7d can be rewritten as $$C(k) = \sum_{n=0}^{\frac{a}{2}-1}(-1)^k\left\{\left(x\left(\frac{a}{2}-i-1\right)-x\left(\frac{a}{2}+i\right)\right)\sin\left[\frac{2\pi}{N}\left(k+\frac{1}{2}\right)\left(i+\frac{1}{2}\right)\right]\right\}+ \quad (10a)$$

$$\sum_{n=\frac{a}{2}}^{\frac{N}{2}-1}(-1)^k\left\{\left(-x\left(\frac{a}{2}+i\right)-x\left(N+\frac{a}{2}-1-i\right)\right)\sin\left[\frac{2\pi}{N}\left(k+\frac{1}{2}\right)\left(i+\frac{1}{2}\right)\right]\right\}, \quad (10b)$$

for $0 \leq k < N$. By folding and shuffling the input signal samples to define a set of modified samples q(i) according to $$q(i) = -x\left(\frac{a}{2}-i-1\right)+x\left(\frac{a}{2}+i\right) \quad (11)$$

for $0 \leq i < 1/2a$, and $$q(i) = x\left(\frac{a}{2}+i\right)+x\left(N+\frac{a}{2}-1-i\right) \quad (12)$$

for $1/2a \leq i < 1/2N$, the subblock transforms in expressions 10a and 10b may be collectively expressed as $$C(k) = (-1)^{k+1}\sum_{i=0}^{\frac{N}{2}-1}q(i)\sin\left[\frac{2\pi}{N}\left(k+\frac{1}{2}\right)\left(i+\frac{1}{2}\right)\right] \quad (13)$$

for $0 \leq k < 1/2N$.

Next, the modified samples q(i) are divided into two groups. The first group includes the even numbered samples, where i=2n, and the second group includes the odd numbered samples, where i=N/2−1−2n. This permits the expression in 13 to be written as $$C(k) = (-1)^{k+1}\sum_{n=0}^{\frac{N}{4}-1}\left\{q(2n)\sin\left[\frac{2\pi}{N}\left(k+\frac{1}{2}\right)\left(2n+\frac{1}{2}\right)\right]+ \quad (14a)$$

$$q\left(\frac{N}{2}-2n-1\right)\sin\left[\frac{2\pi}{N}\left(k+\frac{1}{2}\right)\left(\frac{N}{2}-2n-\frac{1}{2}\right)\right]\right\} \quad (14b)$$

for $0 \leq k < 1/2N$

By making substitutions using the following two identities, $$\sin(\theta + k\pi) = (-1)^k\sin\theta \quad (15)$$

$$\sin\left(\theta \pm \frac{\pi}{2}\right) = \pm\cos\theta \quad (16)$$

and substituting 2p for k in expressions 14a and 14b, the transform for the even-numbered coefficients can be rewritten as $$C(2p) = -\sum_{n=0}^{\frac{N}{4}-1}\left\{q(2n)\sin\left[\frac{2\pi}{N}\left(2p+\frac{1}{2}\right)\left(2n+\frac{1}{2}\right)\right]+ \quad (17)$$

$$q\left(\frac{N}{2}-2n-1\right)\cos\left[\frac{2\pi}{N}\left(2p+\frac{1}{2}\right)\left(2n+\frac{1}{2}\right)\right]\right\}$$

for $0 \leq k < 1/4N$.

By making substitutions using the two identities shown above in expressions 15 and 16, and substituting N/2−1−2p for k in expressions 14a and 14b, the transform for the odd-numbered coefficients can be rewritten as $$C(N/2-1-2p) = -\sum_{n=0}^{\frac{N}{4}-1} \left\{ q(2n)\sin\left[\frac{2\pi}{N}\left(\frac{N}{2}-2p-\frac{1}{2}\right)\left(2n+\frac{1}{2}\right)\right] + q\left(\frac{N}{2}-2n-1\right)\cos\left[\frac{2\pi}{N}\left(\frac{N}{2}-2p-\frac{1}{2}\right)\left(2n+\frac{1}{2}\right)\right] \right\} \quad (18)$$

for $0 \leq k < \frac{1}{4}N$ and, by using the identities shown above in expressions 9 and 16, $$C(N/2-1-2p) = -\sum_{n=0}^{\frac{N}{4}-1} \left\{ q(2n)\cos\left[\frac{2\pi}{N}\left(2p+\frac{1}{2}\right)\left(2n+\frac{1}{2}\right)\right] - q\left(\frac{N}{2}-2n-1\right)\sin\left[\frac{2\pi}{N}\left(2p+\frac{1}{2}\right)\left(2n+\frac{1}{2}\right)\right] \right\}. \quad (19)$$

By combining the even- and odd-numbered modified samples to form complex-valued samples g(n) according to the form $$g(n) = q(N/2-1-2n) + j \cdot q(2n), \quad (20)$$

it can be shown that the O-TDAC transform coefficients C(k) may be obtained from the real and imaginary parts of the transform $$G(p) = \sum_{n=0}^{N/4-1} g(n) e^{-j\frac{2\pi}{N/4}\left(p+\frac{1}{4}\right)\left(n+\frac{1}{4}\right)}. \quad (21)$$

In particular, $$C(2p) = -Re\{G(p)\} \text{ for } 0 \leq p < 1/4N, \quad (22)$$

and $$C(N/2-1-2p) = Im\{G(p)\} \text{ for } 0 \leq p < 1/4N \quad (23)$$

where

Re{G(p)}=real part of the complex quantity G(p), and
Im{G(p)}=imaginary part of the complex quantity G(p). (24)

Expression 21 may be rewritten as $$G(p) = \left\{ \sum_{n=0}^{N/4-1} \left[ g(n) e^{-j\frac{2\pi}{N}\left(n+\frac{1}{8}\right)} \right] e^{-j\frac{2\pi}{N/4}pn} \right\} e^{-j\frac{2\pi}{N}\left(p+\frac{1}{8}\right)} \quad (25)$$

where the first term within the square brackets, $$g(n) e^{-j\frac{2\pi}{N}\left(n+\frac{1}{8}\right)} \quad (26)$$

forms part of the forward pre-transform function. The summation and exponential on either side of the pre-transform function may be recognized as an N/4-point Discrete Fourier Transform (DFT).

For ease of discussion herein, the transform coefficients obtained from the forward transform of the modified samples q(n) are denoted Q(p). These complex-valued coefficients are of the form $$Q(p) = U(p) + j \cdot V(p). \quad (27)$$

Referring again to expression 25, the final term outside the braces, $$e^{-j\frac{2\pi}{N}\left(p+\frac{1}{8}\right)} \quad (28)$$

is a complex rotation that forms part of a forward post-transform function discussed below.

Figure 3:
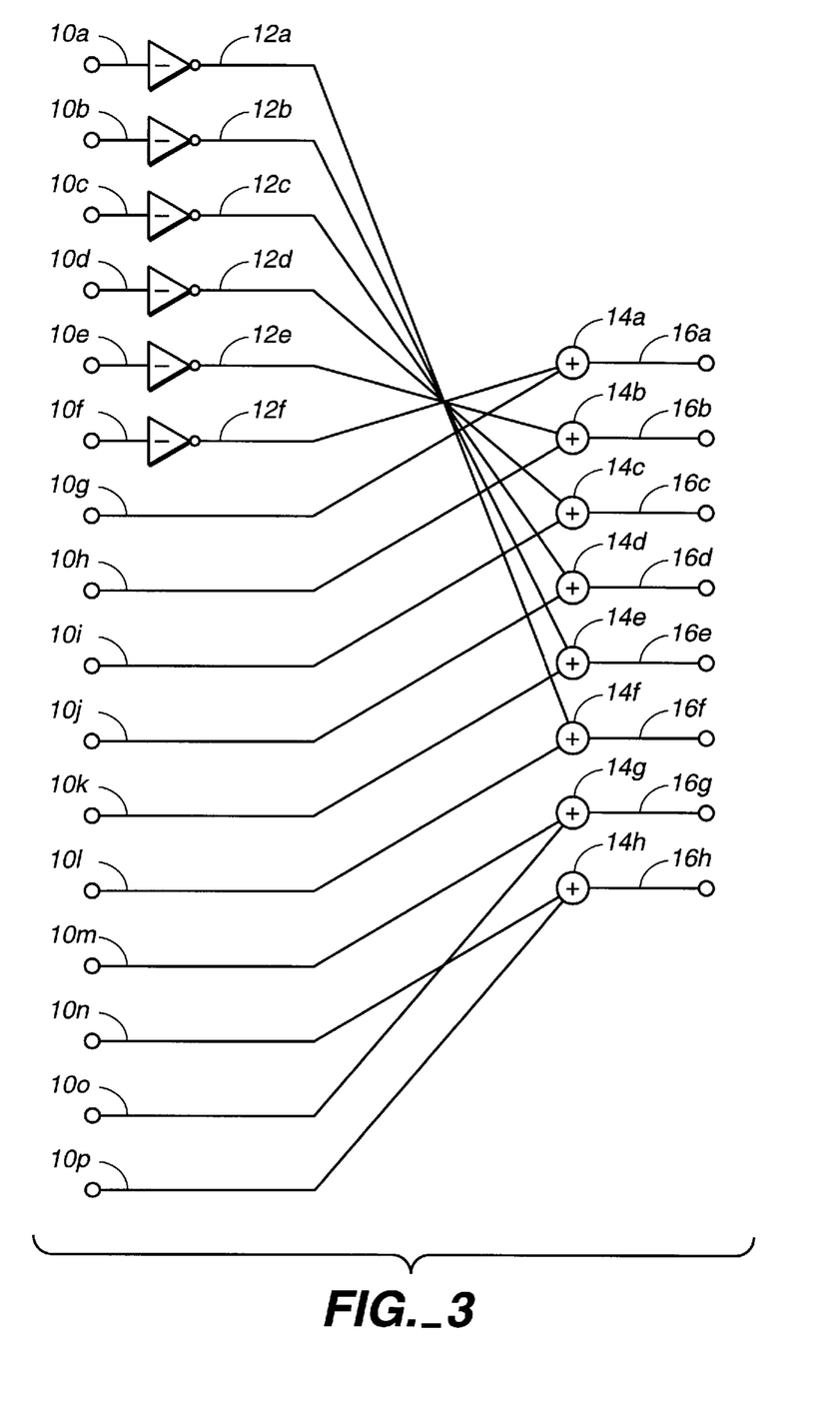
FIG. 3 is a schematic diagram illustrating the folding and shuffling of signal samples in a forward pre-transform function.

FIG. 3 is a schematic diagram of a circuit for deriving a block of 8 modified samples from a 16-sample block according to equations 11 and 12, where a=12 and b=4. Paths 10a through 10p each receive a signal representing the first through sixteenth sample in an input signal block, respectively. Paths 16a through 16h each convey a signal representing the first through eighth modified sample in a modified-sample block, respectively. Inverters 12a through 12f invert the signals received from paths 10a through 10f, respectively, thereby achieving a subtraction in summing components 14a through 14f.

The forward pre-transform function, forward transform and forward post-transform function can be implemented in a variety of ways including circuits comprising inverters, amplifiers and summing components such as that represented in FIG. 3; however, preferred embodiments incorporate software-controlled processors to perform these operations. Any of these implementations may also apply an analysis-window function to the signal samples in conjunction with the folding and shuffling operations of the forward pre-transform function.

E. Efficient Implementation of Analysis Filter Bank

Forward pre-transform function 106, represented by expressions 11, 12, 20 and 26 above, is used to obtain a set of ¼N complex-valued modified samples to be provided as input to forward transform 108. Expressions 11, 12 and 20 collectively represent "folding" and "shuffling" operations on the signal samples in each time-domain signal sample block, forming a respective set of modified samples. Expression 26 represents a complex rotation of these modified samples.

Forward transform 108 is an N/4-point DFT that may be implemented efficiently in a variety of ways, including the use of an FFT.

Forward post-transform 110, represented by expressions 22, 23 and 28 above, is used to obtain spectral information comprising the frequency-domain transform coefficients C(k) from the transform coefficients Q(p) of the forward transform. Expressions 22 and 23 collectively represent an "unshuffling" operation that reverses the affects of the shuffling performed by the forward pre-transform function. Expression 28 represents a complex rotation. The forward post-transform function may be implemented by the following:

$$C(2p) = -U(p)\cos\left[\frac{2\pi}{N}\left(p+\frac{1}{8}\right)\right] - V(p)\sin\left[\frac{2\pi}{N}\left(p+\frac{1}{8}\right)\right] \quad (29)$$

for $0 \leq p < 1/4N$ $$C(N/2-1-2p) = V(p)\cos\left[\frac{2\pi}{N}\left(p+\frac{1}{8}\right)\right] - U(p)\sin\left[\frac{2\pi}{N}\left(p+\frac{1}{8}\right)\right] \quad (30)$$

for $0 \leq p < 1/4N$

In principle, the combination of forward pre-transform 106, forward transform 108 and forward post-transform 110 generates frequency-domain transform coefficients C(k) in response to an input signal that is equivalent to the transform coefficients generated by an O-TDAC transform applied to the same input signal. These transform coefficients generally correspond to the spectral content of the input signal. If a particular application does not require spectral information in any particular form, an analysis-filtering apparatus incorporating an embodiment of the present invention may incorporate a forward post-transform that is null or trivial. A system for such an application, for example, could transmit or store the transform coefficients Q(p) themselves.

Unfortunately, the transform coefficients Q(p) generated by the forward transform are generally not suitable for low bit-rate transmission or efficient storage. Various coding and quantization techniques are needed to reduce informational requirements by taking advantage of a signal's irrelevancy. In such coding applications, a straight-forward measure of input signal spectral content is required. For example, encoder/decoder systems which exploit psychoacoustic principles to reduce coded signal information requirements require an estimate of spectral content in order to estimate psychoacoustic masking effects of a signal's spectral components.

F. Output Formatting

Output formatting represented by box 112 in FIG. 1 is not required to practice the present invention but is often used in signal encoding applications. Generally, output formatting assembles a representation of the spectral information and other information required for transmission or storage. In a coding application, any additional side-information needed by a decoder is also assembled into the formatted signal. Frame synchronization bits and error detection/correction codes may be used as needed for transmission. Database pointers or keys may be added as needed for storage. The formatted data is ready for transmission or for storage along path 114 shown in FIG. 1.

G. Input Deformatting

Input deformatting represented by box 202 in FIG. 2 is not required to practice the present invention but is often used in signal decoding applications. Deformatting obtains spectral information and any side information from a formatted signal received from path 200 either by receipt of a transmitted signal or retrieved from storage.

H. Synthesis Filter Bank

Synthesis filter bank 220 may implemented in a straight-forward manner by an Inverse Modified Discrete Cosine Transform (IMDCT) of the form $$\hat{x}(n) = \frac{2}{N} \sum_{k=0}^{N-1} \hat{C}(k) \cos\left[ \frac{2\pi}{N} \left( k + \frac{1}{2} \right)(n+m) \right] \quad (31)$$

for $0 \leq n < N$ where $\hat{C}(k)$=recovered MDCT frequency-domain transform coefficient k, and $\hat{x}(n)$=recovered time-domain signal sample n.

The "hat" nomenclature is used herein to distinguish between information derived during signal synthesis from corresponding information derived during signal analysis. In many practical applications, because of coding and/or quantizing that may have been performed, spectral information recovered from the received signal may not be identical to the spectral information obtained from the analysis filter bank. As a result, corresponding information between signal analysis and signal synthesis will generally not be identical; however, this difference is not important to the practice of the present invention.

I. Implementation of Adaptive-Length Synthesis Filter Bank

The resources required to implement the synthesis filter bank according to one embodiment may be reduced by instead applying an inverse pre-transform function to spectral information obtained from a received signal to generate sets of ¼N modified frequency-domain coefficients, evaluating one or more inverse discrete transforms for the modified frequency-domain coefficients, and then applying an inverse post-transform function. As discussed herein, in certain applications the inverse pre-transform function may be essentially null or trivial.

Using a derivation similar to that discussed above for the forward transform, it can be shown that the overall function of inverse pre-transform 206, inverse transform 208 and inverse post-transform 210 may be expressed as $$\hat{g}(n) = \left\{ \frac{4}{N} \sum_{p=0}^{N/4-1} [\hat{G}(p) e^{j\frac{2\pi}{N}(p+\frac{1}{8})}] e^{-j\frac{2\pi}{N/4}pn} \right\} e^{j\frac{2\pi}{N}(n+\frac{1}{8})} \quad (32)$$

where $$Re\{\hat{G}(p)\} = -\hat{C}(2p) \text{ for } 0 \leq p < 1/4N, \quad (33)$$

and $$Im\{\hat{G}(p)\} = \hat{C}(1/2N - 1 - 2p) \text{ for } 0 \leq p < 1/4N. \quad (34)$$

Time-domain signal samples are obtained as follows:

$$\hat{x}\left( \frac{2a+b}{2} - 1 - 2n \right) = Re\{\hat{g}(n)\} \text{ for } 0 \leq n < 1/4b \quad (35)$$

$$\hat{x}\left( \frac{2a+b}{2} + 2n \right) = Re\{\hat{g}(n)\} \text{ for } 0 \leq n < 1/4b \quad (36)$$

$$\hat{x}\left( \frac{2a+b}{2} - 1 - 2n \right) = Re\{\hat{g}(n)\} \text{ for } 1/4b \leq n < 1/4N \quad (37)$$

$$\hat{x}\left( 2n - \frac{b}{2} \right) = -Re\{\hat{g}(n)\} \text{ for } 1/4b \leq n < 1/4N \quad (38)$$

$$\hat{x}\left( \frac{a}{2} + 2n \right) = Im\{\hat{g}(n)\} \text{ for } 0 \leq n < 1/4a \quad (39)$$

$$\hat{x}\left( \frac{a}{2} - 1 - 2n \right) = Im\{\hat{g}(n)\} \text{ for } 0 \leq n < 1/4a \quad (40)$$

$$\hat{x}\left( \frac{a}{2} + 2n \right) = Im\{\hat{g}(n)\} \text{ for } 1/4a \leq n < 1/4N \quad (41)$$

$$\hat{x}\left( \frac{a}{2} + N - 1 - 2n \right) = Im\{\hat{g}(n)\} \text{ for } 1/4a \leq n < 1/4N \quad (42)$$

The complex rotation within the square brackets in expression 32, $$e^{j\frac{2\pi}{N}(p+\frac{1}{8})}, \quad (43)$$

and equations 33 and 34 collectively form the inverse pre-transform function discussed above. The summation and exponential on either side of the inverse pre-transform function in expression 32 may be recognized as an N/4-point Inverse Discrete Fourier Transform (IDFT). The final term outside the braces in expression 31, $$e^{j\frac{2\pi}{N}(n+\frac{1}{8})}, \quad (44)$$

and equations 35 through 42 collectively form the inverse post-transform function.

J. Efficient Implementation of Synthesis Filter Bank

Inverse pre-transform function 206 obtains frequency-domain transform coefficients from the spectral information in the received signal. If the spectral information in the received signal substantially corresponds to the frequency-domain transform coefficients Q(p) generated by the forward transform, then the inverse pre-transform function may be null or trivial such as, for example, grouping spectral information into blocks. In a practical implementation of a decoder incorporating the present invention, the inverse pre-transform function may comprise decoding and dequantizing an encoded signal into a form suitable for input to the inverse transform filter bank.

In applications where the received spectral information is substantially the same as the transform coefficients C(k) of an O-TDAC filter bank, an inverse pre-transform function may be used to derive frequency-domain coefficients of the form $$\hat{Q}(p) = \hat{U}(p) + j \cdot \hat{V}(p). \quad (45)$$

The inverse pre-transform function may be implemented by the following:

$$\hat{U}(p) = -\hat{C}(2p)\cos\left[\frac{2\pi}{N}\left(p+\frac{1}{8}\right)\right] - \quad (46)$$

$$\hat{C}\left(\frac{N}{2}-1-2p\right)\sin\left[\frac{2\pi}{N}\left(p+\frac{1}{8}\right)\right] \text{ for } 0 \leq p < 1/4N$$

$$\hat{V}(p) = \hat{C}\left(\frac{N}{2}-1-2p\right)\cos\left[\frac{2\pi}{N}\left(p+\frac{1}{8}\right)\right] - \quad (47)$$

$$\hat{C}(2p)\sin\left[\frac{2\pi}{N}\left(p+\frac{1}{8}\right)\right] \text{ for } 0 \leq p < 1/4N$$

Inverse transform 208 is an N/4-point IDFT that may be implemented efficiently in a variety of ways, including the use of an Inverse FFT.

Inverse post-transform 210, represented by expressions 44 and 35 through 42, is used to obtain a set of N real-valued time-domain samples in response to the time-domain transform coefficients provided by inverse transform 208. Expression 44 represents a complex rotation. Expressions 35 through 42 collectively represent "unfolding" and "unshuffling" operations that reverse the effects of previous shuffling and unshuffling, including the shuffling of forward pre-transform 106.

K. Output Sample Processing

An overlap-add process is used subsequent to an O-TDAC transform to generate signal samples corresponding to the original input signal samples. This process, represented by box 212 in FIG. 2, overlaps adjacent blocks of recovered time-domain samples and adds the samples in one block to samples in the adjacent overlapped block. Prior to overlap-add a synthesis-window function is applied to the recovered time-domain sample blocks.

I claim:

1. An analysis-filtering apparatus comprising
input means for receiving an input signal, said input signal comprising input samples and representing audio or video information,
input buffer means for grouping said input samples into time-domain signal sample blocks of non-zero length N=a+b, where a and b are non-negative radix 4 integers and either a or b has a different value for at least two of said time-domain signal sample blocks, wherein adjacent blocks in a sequence of said time-domain signal sample blocks overlap one another, a respective time-domain signal sample block overlapping a previous block by a samples and overlapping a subsequent block by b samples,
analysis filter bank for generating spectral information in response to a respective one of said time-domain signal sample blocks, said analysis filter bank comprising
forward pre-transform means for generating modified-sample blocks comprising at least one but not more than ¼N complex-valued modified samples,
forward transform means for generating frequency-domain transform coefficients by applying one or more discrete transform functions to said modified-sample blocks, and
forward post-transform means for generating spectral information in response to said frequency-domain coefficients, and
output means for assembling a representation of said spectral information into a form suitable for transmission or storage.

2. An apparatus according to claim 1 wherein said spectral information is substantially equivalent to transform coefficients of an Oddly-stacked Time Domain Aliasing Cancellation transform.

3. An apparatus according to claim 1 wherein said forward pre-transform means comprises
means for forming real-valued intermediate samples q(i) in response to said input samples x(i) according to $$q(i) = -x\left(\frac{a}{2}-i-1\right) + x\left(\frac{a}{2}+i\right) \text{ for } 0 \leq i < 1/2a$$

and $$q(i) = x\left(\frac{a}{2}+i\right) + x\left(N+\frac{a}{2}-1-i\right) \text{ for } 1/2 \leq i < 1/2N,$$

means for forming complex-valued intermediate samples g(n) according to $$g(n) = q(N/2-1-2n) + jq(2n), \text{ and}$$

means for generating said complex-valued modified samples by applying a complex rotation according to $$e^{-j\frac{2\pi}{N}(n+\frac{1}{8})},$$

and wherein said one or more discrete transform functions are substantially equivalent to a Discrete Fourier Transform.

4. An apparatus according to claim 3 wherein said forward post-transform means comprises
means for forming complex-valued intermediate coefficients G(p) by applying a complex rotation to said frequency-domain coefficients according to $$e^{-j\frac{2\pi}{N}(p+\frac{1}{8})},$$

and
means for generating said spectral information C(p) according to $$C(2p) = -Re\{G(p)\} \text{ for } 0 \leq p < 1/4N$$

and $$C(N/2 - 1 - 2p) = Im\{G(p)\} \text{ for } 0 \leq p < 1/4N.$$

5. An apparatus according to any one of claims 1 through 4 wherein a and b are non-zero.

6. A synthesis-filtering apparatus comprising input means for receiving spectral information, synthesis filter bank for generating time-domain signal samples in response to said spectral information, said synthesis filter bank comprising inverse pre-transform means for generating sets of frequency-domain transform coefficients in response to said spectral information, each of said sets comprising at least one but not more than ¼N=¼(a+b) coefficients, where a and b are non-negative radix 4 integers and either a or b has a different value in at least two of said sets, inverse transform means for generating transform blocks comprising time-domain transform coefficients by applying one or more inverse discrete transform functions to said sets of frequency-domain transform coefficients, and inverse post-transform means for generating time-domain signal sample blocks, each block of non-zero length N=a+b, wherein adjacent blocks in a sequence of said time-domain signal sample blocks overlap one another, a respective time-domain signal sample block overlapping a previous block by a samples and overlapping a subsequent block by b samples, and output means for generating output samples representing audio or video information in response to said time-domain signal sample blocks.

7. An apparatus according to claim 6 wherein said spectral information is substantially equivalent to transform coefficients of an Oddly-stacked Time Domain Aliasing Cancellation transform.

8. An apparatus according to claim 6 wherein said one or more inverse discrete transform functions are substantially equivalent to an Inverse Discrete Fourier Transform and said inverse post-transform means comprises means for forming complex-valued intermediate samples ĝ(p) by applying a complex rotation to said time-domain transform coefficients according to $$e^{-j\frac{2\pi}{N}(n+\frac{1}{8})},$$

and means for generating said time-domain signal samples x̂(n) according to $$\hat{x}\left(\frac{2a+b}{2} - 1 - 2n\right) = Re\{\hat{g}(n)\} \text{ for } 0 \leq n < 1/4b,$$

$$\hat{x}\left(\frac{2a+b}{2} + 2n\right) = Re\{\hat{g}(n)\} \text{ for } 0 \leq n < 1/4b,$$

$$\hat{x}\left(\frac{2a+b}{2} - 1 - 2n\right) = Re\{\hat{g}(n)\} \text{ for } 1/4b \leq n < 1/4N,$$

$$\hat{x}\left(2n\frac{b}{2}\right) = -Re\{\hat{g}(n)\} \text{ for } 1/4b \leq n < 1/4N,$$

-continued $$\hat{x}\left(\frac{a}{2} + 2n\right) = Im\{\hat{g}(n)\} \text{ for } 0 \leq n < 1/4a,$$

$$\hat{x}\left(\frac{a}{2} - 1 - 2n\right) = -Im\{\hat{g}(n)\} \text{ for } 0 \leq n < 1/4a,$$

$$\hat{x}\left(\frac{a}{2} + 2n\right) = Im\{\hat{g}(n)\} \text{ for } 1/4a \leq n < 1/4N$$

and $$\hat{x}\left(\frac{a}{2} + N - 1 - 2n\right) = Im\{\hat{g}(n)\} \text{ for } 1/4a \leq n < 1/4N.$$

9. An apparatus according to claim 8 wherein said inverse pre-transform means comprises means for forming complex-valued intermediate coefficients Ĝ(p) in response to said spectral information Ĉ(p) according to $$Re\{\hat{G}(p)\} = -\hat{C}(2p) \text{ for } 0 \leq p < 1/4N$$

and $$Im\{\hat{G}(p)\} = \hat{C}(1/2N - 1 - 2p) \text{ for } 0 \leq p < 1/4N, \text{ and}$$

means for generating said frequency-domain transform coefficients by applying a complex rotation according to $$e^{j\frac{2\pi}{N}(p+\frac{1}{8})}.$$

10. An apparatus according to any one of claims 6 through 9 wherein a and b are non-zero.

11. A method for encoding and decoding samples representing audio or video information, said method comprising a) receiving an input signal, said input signal comprising input samples and representing audio or video information, b) grouping said input samples into first time-domain signal sample blocks of non-zero length N=a+b, where a and b are non-negative radix 4 integers and either a or b has a different value for at least two of said time-domain signal sample blocks, wherein adjacent blocks in a sequence of said time-domain signal sample blocks overlap one another, a respective time-domain signal sample block overlapping a previous block by a samples and overlapping a subsequent block by b samples, c) generating spectral information in response to a respective one of said first time-domain signal sample blocks by (1) generating modified-sample blocks comprising at least one but not more than ¼N complex-valued modified samples, (2) generating first frequency-domain transform coefficients by applying one or more discrete transform functions to said modified-sample blocks, and (3) generating spectral information in response to said frequency-domain coefficients, d) assembling an encoded representation of said spectral information into a form suitable for transmission or storage, e) receiving said encoded representation of spectral information and obtaining reconstructed spectral information therefrom, f) generating time-domain signal samples in response to said reconstructed spectral information by (1) generating sets of second frequency-domain transform coefficients in response to said spectral information, each of said sets comprising at least one but not more than ¼N=¼(a+b) coefficients, where either a or b has a different value in at least two of said sets, (2) generating transform blocks comprising time-domain transform coefficients by applying one or more inverse discrete transform functions to said sets of second frequency-domain transform coefficients, and (3) generating second time-domain signal sample blocks, each block of non-zero length N wherein adjacent blocks in said second time-domain signal sample blocks overlap one another, a respective second time-domain signal sample block overlapping a previous block by a samples and overlapping a subsequent block by b samples, and g) generating output samples representing audio or video information in response to said second time-domain signal sample blocks.

12. A method according to claim 11 wherein said spectral information is substantially equivalent to transform coefficients of an Oddly-stacked Time Domain Aliasing Cancellation transform.

13. A method according to claim 11 wherein said generating modified-sample blocks comprises forming real-valued intermediate samples q(i) in response to said input samples x(i) according to $$q(i) = -x\left(\frac{a}{2} - i - 1\right) + x\left(\frac{a}{2} + i\right) \text{ for } 0 \leq i < 1/2a,$$

and $$q(i) = x\left(\frac{a}{2} + i\right) + x\left(N + \frac{a}{2} - 1 - i\right) \text{ for } 1/2 \leq i < 1/2N,$$

forming complex-valued intermediate samples g(n) according to $$g(n) = q(N/2 - 1 - 2n) + jq(2n), \text{ and}$$

generating said complex-valued modified samples by applying a complex rotation according to $$e^{-j\frac{2\pi}{N}(n+\frac{1}{8})},$$

said one or more discrete transform functions are substantially equivalent to a Discrete Fourier Transform, said one or more inverse discrete transforms are substantially equivalent to an Inverse Discrete Fourier Transform, and said generating second time-domain signal sample blocks comprises forming complex-valued intermediate samples ĝ(p) by applying a complex rotation to said time-domain transform coefficients according to $$e^{-j\frac{2\pi}{N}(n+\frac{1}{8})},$$

and generating said time-domain signal samples x̂(n) according to $$\hat{x}\left(\frac{2a+b}{2} - 1 - 2n\right) = Re\{\hat{g}(n)\} \text{ for } 0 \leq n < 1/4b,$$

-continued $$\hat{x}\left(\frac{2a+b}{2} + 2n\right) = Re\{\hat{g}(n)\} \text{ for } 0 \leq n < 1/4b,$$

$$\hat{x}\left(\frac{2a+b}{2} - 1 - 2n\right) = Re\{\hat{g}(n)\} \text{ for } 1/4b \leq n < 1/4N,$$

$$\hat{x}\left(2n - \frac{b}{2}\right) = -Re\{\hat{g}(n)\} \text{ for } 1/4b \leq n < 1/4N,$$

$$\hat{x}\left(\frac{a}{2} + 2n\right) = Im\{\hat{g}(n)\} \text{ for } 0 \leq n < 1/4a,$$

$$\hat{x}\left(\frac{a}{2} - 1 - 2n\right) = -Im\{\hat{g}(n)\} \text{ for } 0 \leq n < 1/4a,$$

$$\hat{x}\left(\frac{a}{2} + 2n\right) = Im\{\hat{g}(n)\} \text{ for } 1/4a \leq n < 1/4N,$$

and $$\hat{x}\left(\frac{a}{2} + N - 1 - 2n\right) = Im\{\hat{g}(n)\} \text{ for } 1/4a \leq n < 1/4N.$$

14. A method according to claim 13 wherein said generating spectral information comprises forming complex-valued intermediate coefficients G(p) by applying a complex rotation to said frequency-domain coefficients according to $$e^{-j\frac{2\pi}{N}(p+\frac{1}{8})},$$

and generating said spectral information C(p) according to $$C(2p) = -Re\{G(p)\} \text{ for } 0 \leq p < 1/4N$$

and $$C(N/2 - 1 - 2p) = Im\{G(p)\} \text{ for } 0 \leq p < 1/4N,$$

and wherein said generating sets of second frequency-domain transform coefficients comprises forming complex-valued intermediate coefficients Ĝ(p) in response to said spectral information Ĉ(p) according to $$Re\{\hat{G}(p)\} = -\hat{C}(2p) \text{ for } 0 \leq p < 1/4N$$

and $$Im\{\hat{G}(p)\} = \hat{C}(1/2N - 1 - 2p) \text{ for } 0 \leq p < 1/4N, \text{ and}$$

generating said frequency-domain transform coefficients by applying a complex rotation according to $$e^{j\frac{2\pi}{N}(p+\frac{1}{8})}.$$

15. A method according to any one of claims 11 through 14 wherein a and b are non-zero.

16. A synthesis-filtering method comprising the steps of:

receiving spectral information, generating sets of frequency-domain transform coefficients in response to said spectral information, each of said sets comprising at least one but not more than ¼N=¼(a+b) coefficients, where a and b are non-negative radix 4 integers and either a or b has a different value in at least two of said sets, generating transform blocks comprising time-domain transform coefficients by applying one or more inverse discrete transform functions to said sets of frequency-domain transform coefficients, and generating time-domain signal sample blocks, each block of non-zero length N=a+b, wherein adjacent blocks in a sequence of said time-domain signal sample blocks overlap one another, a respective time-domain signal sample block overlapping a previous block by a samples and overlapping a subsequent block by b samples, and generating output samples representing audio or video information in response to said time-domain signal sample blocks.

17. A method according to claim 16 wherein said spectral information is substantially equivalent to transform coefficients of an Oddly-stacked Time Domain Aliasing Cancellation transform.

18. A method according to claim 16 wherein said one or more inverse discrete transform functions are substantially equivalent to an Inverse Discrete Fourier Transform and said step for generating time-domain signal sample blocks comprises forming complex-valued intermediate samples $\hat{g}(p)$ by applying a complex rotation to said time-domain transform coefficients according to $$e^{-j\frac{2\pi}{N}(n+\frac{1}{8})},$$

and generating said time-domain signal samples $\hat{x}(n)$ according to $$\hat{x}\left(\frac{2a+b}{2} - 1 - 2n\right) = Re\{\hat{g}(n)\} \text{ for } 0 \le n < 1/4b,$$

$$\hat{x}\left(\frac{2a+b}{2} + 2n\right) = Re\{\hat{g}(n)\} \text{ for } 0 \le n < 1/4b,$$

$$\hat{x}\left(\frac{2a+b}{2} - 1 - 2n\right) = Re\{\hat{g}(n)\} \text{ for } 1/4b \le n < 1/4N,$$

-continued $$\hat{x}\left(2n - \frac{b}{2}\right) = -Re\{\hat{g}(n)\} \text{ for } 1/4b \le n < 1/4N,$$

$$\hat{x}\left(\frac{a}{2} + 2n\right) = Im\{\hat{g}(n)\} \text{ for } 0 \le n < 1/4a,$$

$$\hat{x}\left(\frac{a}{2} - 1 - 2n\right) = -Im\{\hat{g}(n)\} \text{ for } 0 \le n < 1/4a,$$

$$\hat{x}\left(\frac{a}{2} + 2n\right) = Im\{\hat{g}(n)\} \text{ for } 1/4a \le n < 1/4N$$

and $$\hat{x}\left(\frac{a}{2} + N - 1 - 2n\right) = Im\{\hat{g}(n)\} \text{ for } 1/4a \le n < 1/4N.$$

19. A method according to claim 18 wherein said step for generating sets of frequency-domain transform coefficients comprises forming complex-valued intermediate coefficients $\hat{G}(p)$ in response to said spectral information $\hat{C}(p)$ according to $$Re\{\hat{G}(p)\} = -\hat{C}(2p) \text{ for } 0 \le p < 1/4N$$

and $$Im\{\hat{G}(p)\} = \hat{C}(1/2N - 1 - 2p) \text{ for } 0 \le p < 1/4N, \text{ and}$$

generating said frequency-domain transform coefficients by applying a complex rotation according to $$e^{j\frac{2\pi}{N}(p+\frac{1}{8})}.$$

20. A method according to any one of claims 16 through 19 wherein a and b are non-zero.

* * * * *

UNITED STATES PATENT AND TRADEMARK OFFICE
CERTIFICATE OF CORRECTION

PATENT NO. : 5,890,106
APPLICATION NO. : 08/821017
DATED : March 30, 1999
INVENTOR(S) : Marina Bosi-Goldberg It is certified that error appears in the above-identified patent and that said Letters Patent is hereby corrected as shown below:

In Column 17 Line 65 of the patent, the formula should appear as follows:

$$\hat{x}(2n - \frac{b}{2}) = -\operatorname{Re}\{\hat{g}(n)\} \qquad \text{for } \tfrac{1}{4}b \leq n < \tfrac{1}{4}N,$$

In Column 19 Line 34 of the patent, the formula should appear as follows:

$$q(i) = x(\frac{a}{2} + i) + x(N + \frac{a}{2} - 1 - i) \qquad \text{for } \tfrac{1}{2}a \leq i < \tfrac{1}{2}N,$$

Signed and Sealed this

Seventeenth Day of July, 2007

JON W. DUDAS
*Director of the United States Patent and Trademark Office*